(12) United States Patent
Hwung et al.

(10) Patent No.: US 10,889,894 B2
(45) Date of Patent: Jan. 12, 2021

(54) FACEPLATE WITH EMBEDDED HEATER

(71) Applicant: Applied Materials, Inc., Santa Clara, CA (US)

(72) Inventors: Daniel Hwung, Los Gatos, CA (US); Yuxing Zhang, Santa Clara, CA (US); Kalyanjit Ghosh, Pleasanton, CA (US); Kaushik Alayavalli, Sunnyvale, CA (US); Amit Kumar Bansal, Milpitas, CA (US)

(73) Assignee: Applied Materials, Inc., Santa Clara, CA (US)

( * ) Notice: Subject to any disclaimer, the term of this patent is extended or adjusted under 35 U.S.C. 154(b) by 67 days.

(21) Appl. No.: 16/510,845

(22) Filed: Jul. 12, 2019

(65) Prior Publication Data
US 2020/0040452 A1 Feb. 6, 2020

Related U.S. Application Data

(60) Provisional application No. 62/715,069, filed on Aug. 6, 2018.

(51) Int. Cl.
| | | |
|---|---|---|
| *C23C 16/40* | (2006.01) | |
| *C23C 16/455* | (2006.01) | |
| *H01L 21/67* | (2006.01) | |

(52) U.S. Cl.
CPC .... *C23C 16/4557* (2013.01); *H01L 21/67069* (2013.01)

(58) Field of Classification Search
CPC .......... C23C 16/4557; C23C 16/45565; H01L 21/67069; H01L 21/67103; H01J 37/32522; H01J 37/32513; H01J 37/32458; H01J 2237/3321; H01J 2237/334

USPC ............... 118/715; 156/345.33, 345.34
See application file for complete search history.

(56) References Cited

U.S. PATENT DOCUMENTS

| 5,350,480 A | * | 9/1994 | Gray | H01L 21/02071 |
| | | | | 134/31 |
| 5,882,411 A | | 3/1999 | Zhao et al. | |
| 6,086,677 A | | 7/2000 | Umotoy et al. | |
| 6,307,184 B1 | | 10/2001 | Womack et al. | |
| 6,453,992 B1 | * | 9/2002 | Kim | C23C 16/45565 |
| | | | | 118/666 |
| 6,758,224 B2 | * | 7/2004 | Nogami | C23C 16/4405 |
| | | | | 134/1.1 |

(Continued)

FOREIGN PATENT DOCUMENTS

KR 20160136238 A 11/2016

OTHER PUBLICATIONS

International Search Report and Written Opinion for Application No. PCT/US2019/041742 dated Oct. 31, 2019.

*Primary Examiner* — Rudy Zervigon
(74) *Attorney, Agent, or Firm* — Patterson + Sheridan, LLP (57) ABSTRACT

A faceplate for a processing chamber is disclosed. The faceplate has a body with a plurality of apertures formed therethrough. A flexure is formed in the body partially circumscribing the plurality of apertures. A cutout is formed through the body on a common radius with the flexure. One or more bores extend from a radially inner surface of the cutout to an outer surface of the body. A heater is disposed between flexure and the plurality of apertures. The flexure and the cutout are thermal chokes which limit heat transfer thereacross from the heater.

20 Claims, 5 Drawing Sheets

(56) References Cited

U.S. PATENT DOCUMENTS

| | | | | |
|---|---|---|---|---|
| 7,531,061 B2* | 5/2009 | Long | ................ | C23C 16/452 118/666 |
| 7,588,804 B2* | 9/2009 | Dando | ............ | C23C 16/4409 427/248.1 |
| 7,776,156 B2* | 8/2010 | Long | ................ | H01J 37/321 118/725 |
| 8,052,795 B2* | 11/2011 | Kang | .................. | C23C 16/46 118/715 |
| 8,187,413 B2* | 5/2012 | Patrick | ........... | H01J 37/32724 156/345.34 |
| 8,216,418 B2* | 7/2012 | Patrick | ........... | H01J 37/32541 156/345.34 |
| 8,272,346 B2* | 9/2012 | Bettencourt | ..... | H01L 21/67069 118/723 E |
| 8,272,347 B2* | 9/2012 | Nasman | ........... | C23C 16/4557 118/723 HC |
| 8,291,856 B2* | 10/2012 | Nasman | ........... | C23C 16/4557 118/723 HC |
| 8,343,307 B2* | 1/2013 | Huston | ............ | H01J 37/32522 156/345.34 |
| 8,470,127 B2* | 6/2013 | de la Llera | ........ | H01J 37/3244 156/345.43 |
| 8,968,512 B2* | 3/2015 | Nishimoto | ....... | H01J 37/32192 156/345.27 |
| 9,034,142 B2 | 5/2015 | Bartlett et al. | | |
| 9,099,398 B2* | 8/2015 | Kang | .................. | C23C 16/507 |
| 9,157,152 B2* | 10/2015 | Faguet | ................ | C23C 16/452 |
| 9,476,120 B2* | 10/2016 | Meinhold | ......... | H01J 37/32724 |
| 9,677,176 B2* | 6/2017 | Chandrasekharan | ....................... | C23C 16/45572 |
| 9,905,400 B2* | 2/2018 | Stowell | ............ | H01J 37/32192 |
| 10,294,565 B2* | 5/2019 | Takahashi | ......... | C23C 16/45544 |
| 10,508,338 B2* | 12/2019 | Matsumoto | ...... | C23C 16/45504 |
| 10,550,473 B2* | 2/2020 | Yamada | ............ | C23C 16/45565 |
| 10,584,415 B2* | 3/2020 | Meinhold | ......... | C23C 16/45563 |
| 10,615,007 B2* | 4/2020 | Stowell | ............ | H01J 37/32119 |
| 2002/0002947 A1* | 1/2002 | Satoyoshi | ......... | H01J 37/32522 118/723 I |
| 2008/0308229 A1* | 12/2008 | Patrick | ............ | H01J 37/32541 156/345.34 |
| 2009/0095218 A1* | 4/2009 | Meinhold | ......... | C23C 16/45572 118/708 |
| 2009/0095219 A1* | 4/2009 | Meinhold | ......... | C23C 16/45565 118/708 |
| 2009/0095220 A1* | 4/2009 | Meinhold | .......... | H01J 37/3244 118/712 |
| 2009/0169744 A1 | 7/2009 | Byun et al. | | |
| 2009/0173444 A1* | 7/2009 | Sago | ................ | C23C 16/5096 156/345.33 |
| 2009/0223452 A1* | 9/2009 | Nasman | ............ | C23C 16/4557 118/724 |
| 2009/0236040 A1* | 9/2009 | Patrick | ............ | C23C 16/45565 156/345.34 |
| 2009/0266300 A1* | 10/2009 | Iizuka | .............. | C23C 16/45561 118/728 |
| 2010/0003829 A1* | 1/2010 | Patrick | ............... | H01L 21/3065 438/758 |
| 2011/0126762 A1* | 6/2011 | Faguet | ................ | C23C 16/452 118/723 ER |
| 2012/0156877 A1 | 6/2012 | Yap et al. | | |
| 2012/0175062 A1* | 7/2012 | de la Llera | ...... | H01J 37/32091 156/345.34 |
| 2014/0103145 A1 | 4/2014 | White et al. | | |
| 2014/0235069 A1 | 8/2014 | Breiling et al. | | |
| 2015/0011096 A1 | 1/2015 | Chandrasekharan et al. | | |
| 2016/0343595 A1 | 11/2016 | Lind et al. | | |
| 2017/0040192 A1* | 2/2017 | Yousif | ............... | H01L 21/67103 |
| 2017/0365443 A1* | 12/2017 | Carducci | ........... | H01J 37/3255 |
| 2018/0233326 A1* | 8/2018 | Tan | .................... | C23C 16/4585 |
| 2019/0040529 A1* | 2/2019 | Verbaas | ........... | C23C 16/45565 |
| 2019/0048467 A1 | 2/2019 | Sanchez et al. | | |
| 2019/0226088 A1* | 7/2019 | Zhang | ................ | C23C 16/4557 |

* cited by examiner

FACEPLATE WITH EMBEDDED HEATER

CROSS-REFERENCE TO RELATED APPLICATIONS

This application claims benefit of U.S. provisional patent application Ser. No. 62/715,069, filed Aug. 6, 2018, which is herein incorporated by reference in its entirety.

BACKGROUND

Field

Embodiments of the present disclosure relate to a faceplate for use in substrate processing chambers, and more specifically, to a thermal choke for use with a heated faceplate.

Description of the Related Art

In the fabrication of integrated circuits, deposition processes such as chemical vapor deposition (CVD) or atomic layer deposition (ALD) are used to deposit films of various materials upon semiconductor substrates. In other operations, a layer altering process, such as etching, is used to expose a portion of a deposited layer for further depositions. Often, these deposition or etching processes are used in a repetitive fashion to fabricate various layers of an electronic device, such as a semiconductor device.

As technology advances, new chemistry and processes are utilized to fabricate ever-increasingly complex circuits and semiconductor devices. Often, these new processes involve higher processing temperatures. Accordingly, processing components used to carry out the processes are regularly exposed to higher temperatures, such as above 350 degrees Fahrenheit.

Therefore, there is a need for improved substrate process chamber components for utilization in elevated temperatures.

SUMMARY

In one embodiment, a processing chamber has a body with a sidewall and a bottom. A lid is coupled to the body defining a process volume therein. A faceplate is coupled to the lid. The faceplate has a body with a first surface, a second surface, and an outer surface extending between the first surface and the second surface. A plurality of apertures is formed through the body between the first surface and the second surface. A flexure is formed in the body surrounding the plurality of apertures partially circumscribing the plurality of apertures. A cutout is formed through the body abutting the flexure. The cutout and the flexure have a common radius.

In another embodiment, a faceplate for a processing chamber has a body with a first surface, a second surface, and an outer surface extending between the first surface and the second surface. A plurality of apertures is formed through the body between the first surface and the second surface. A flexure is formed in the body surrounding the plurality of apertures. The flexure partially circumscribes the plurality of apertures. A cutout is formed through the body abutting the flexure defining a radially inner surface and a radially outer surface therein. The cutout and the flexure have a common radius.

In yet another embodiment, a faceplate for a processing chamber has a body with a first surface, a second surface, and an outer surface extending between the first surface and the second surface. A plurality of apertures is formed through a central portion of the body between the first surface and the second surface. A flexure is formed in the body partially circumscribing the plurality of apertures. A cutout is formed between the first surface and the second surface of the body. A radially inner surface and a radially outer surface are defined within the cutout. The cutout and the flexure are located on a common radius. One or more bores extend between the outer surface of the body and the radially outer surface of the cutout. A tube extends from the radially inner surface of the cutout through each of the one or more bores. A cap is disposed in each of the one or more bores and surround a portion of each tube.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure relates to a faceplate for a processing chamber. The faceplate has a body with a plurality of apertures formed therethrough. A flexure is formed in the body partially circumscribing the plurality of apertures. A cutout is formed through the body on a common radius with the flexure. One or more bores extend from a radially inner surface of the cutout to an outer surface of the body. A heater is disposed between flexure and the plurality of apertures. The flexure and the cutout are thermal chokes which limit heat transfer thereacross from the heater. A plurality of seals is disposed radially outward of the flexure and maintained at a lower temperature than a temperature of the central portion of the body.

Figure 1:
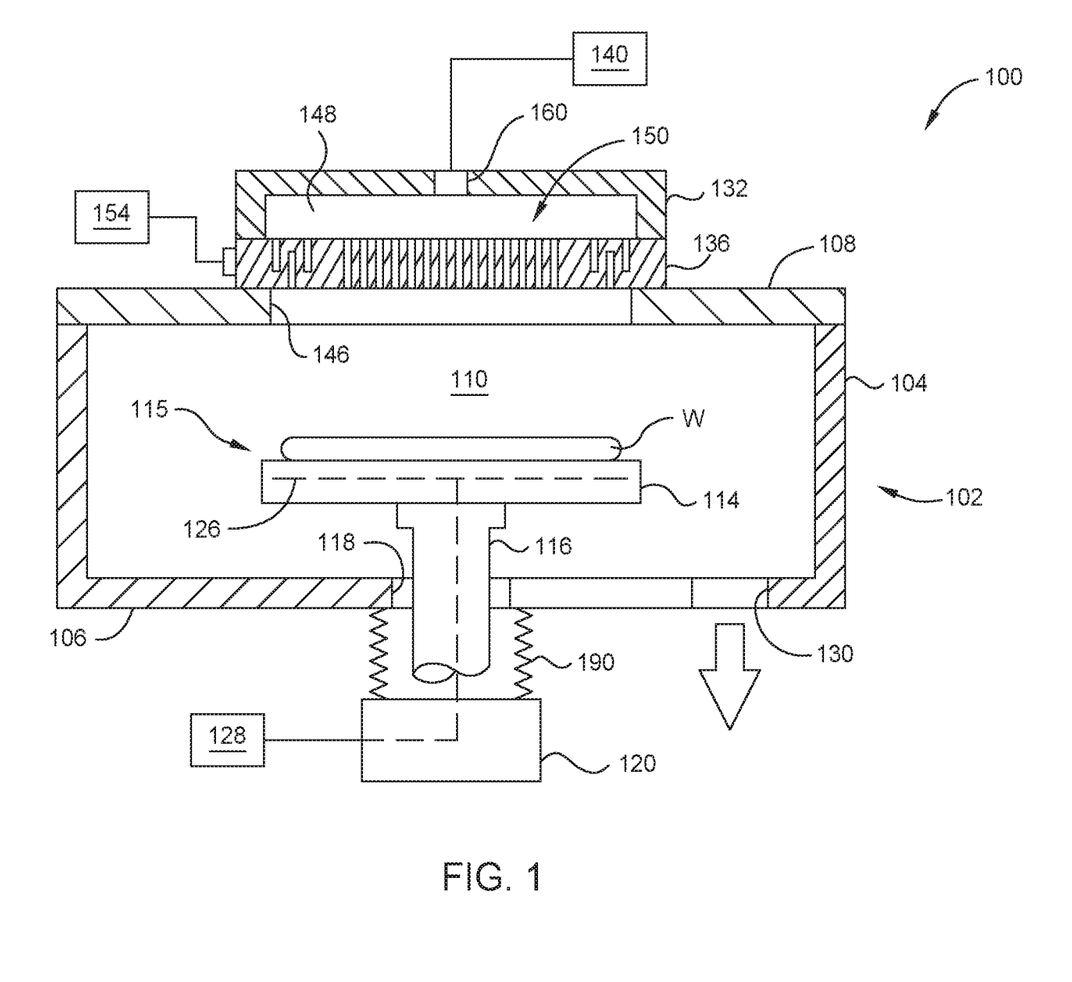
FIG. 1 illustrates a schematic cross-sectional view of a processing chamber according to one embodiment of the disclosure.

FIG. 1 illustrates a schematic arrangement, in partial cross-section, of a processing chamber 100 according to one embodiment. The processing chamber 100 includes a chamber body 102 having a sidewall 104 and bottom 106. A lid 108 couples to the chamber body 102 to define a process volume 110 therein. In one embodiment, the chamber body 102 is formed from a metal, such as aluminum or stainless steel. However, any material suitable for use with processes performed in the processing chamber 100 may be utilized.

A faceplate 136 is coupled to the lid 108. A plurality of apertures 150 are formed through the faceplate 136 and in fluid communication with the process volume 110 though an opening 146 formed in the lid 108. A cover plate 132 is coupled to the faceplate 136 defining a plenum 148 therebetween. A gas in flowed into the plenum 148 from a gas panel 140 through an inlet port 160 formed in the cover plate 132. A power supply 154 is in communication with a heater (not shown) disposed in the faceplate 136 for raising a temperature thereof. The gas flows from the plenum 148, through the apertures 150 in the heated faceplate 136, and into the process volume 110.

A substrate support 115 is disposed within the process volume 110 for supporting a substrate W thereon. The substrate support 115 includes a support body 114 coupled to a shaft 116. The shaft 116 is coupled to the support body 114 and extends out of the chamber body 102 through an opening 118 in the bottom 106. The shaft 116 is coupled to an actuator 120 to vertically actuate the shaft 116, and the support body 114 coupled thereto, between a substrate loading position and a processing position. A bellows 190 is coupled to the bottom 106 and the actuator 120 surrounding the shaft 116 to seal the process volume 110 therein. A vacuum system (not shown) is fluidly coupled to the process volume 110 through an opening 130 in order to evacuate effluent from the process volume 110.

To facilitate processing of a substrate W in the processing chamber 100, the substrate W is disposed on the support body 114 opposite of the shaft 116. An electrode 126 is optionally disposed within the support body 114 and electrically coupled to a power source 128 through the shaft 116. The electrode 126 is selectively biased by the power source 128 to create an electromagnetic field to electrostatically chuck the substrate W to the support body 114. In certain embodiments, the electrode 126 is a heating electrode capable of increasing a temperature of the support body 114 and the substrate W when supported thereon.

Figure 2:
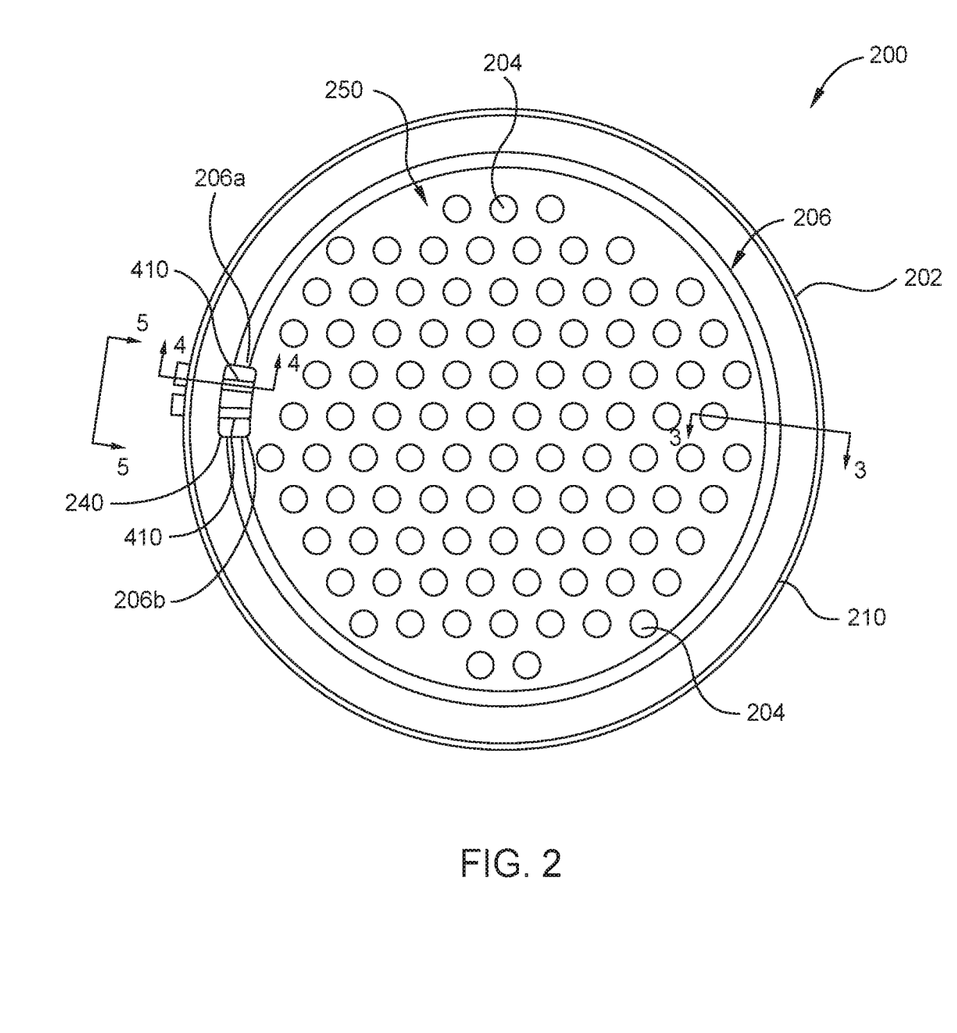
FIG. 2 illustrates a top-down view of a faceplate according to another embodiment of the disclosure.

FIG. 2 illustrates a top-down view of a faceplate 200 which can be used as the faceplate 136 of FIG. 1. The faceplate 200 has a circular body 202, though other shapes such as square or ovoid may be used. The body 202 is formed from a metal, such as aluminum or stainless steel. In one embodiment, the body 202 is formed from two portions 202a and 202b (FIGS. 3 and 4) which are coupled to each other, such as by brazing, bonding, or welding, among other methods. A plurality of apertures 204 are formed through the body 202 in a central portion 250 thereof.

Figure 3:
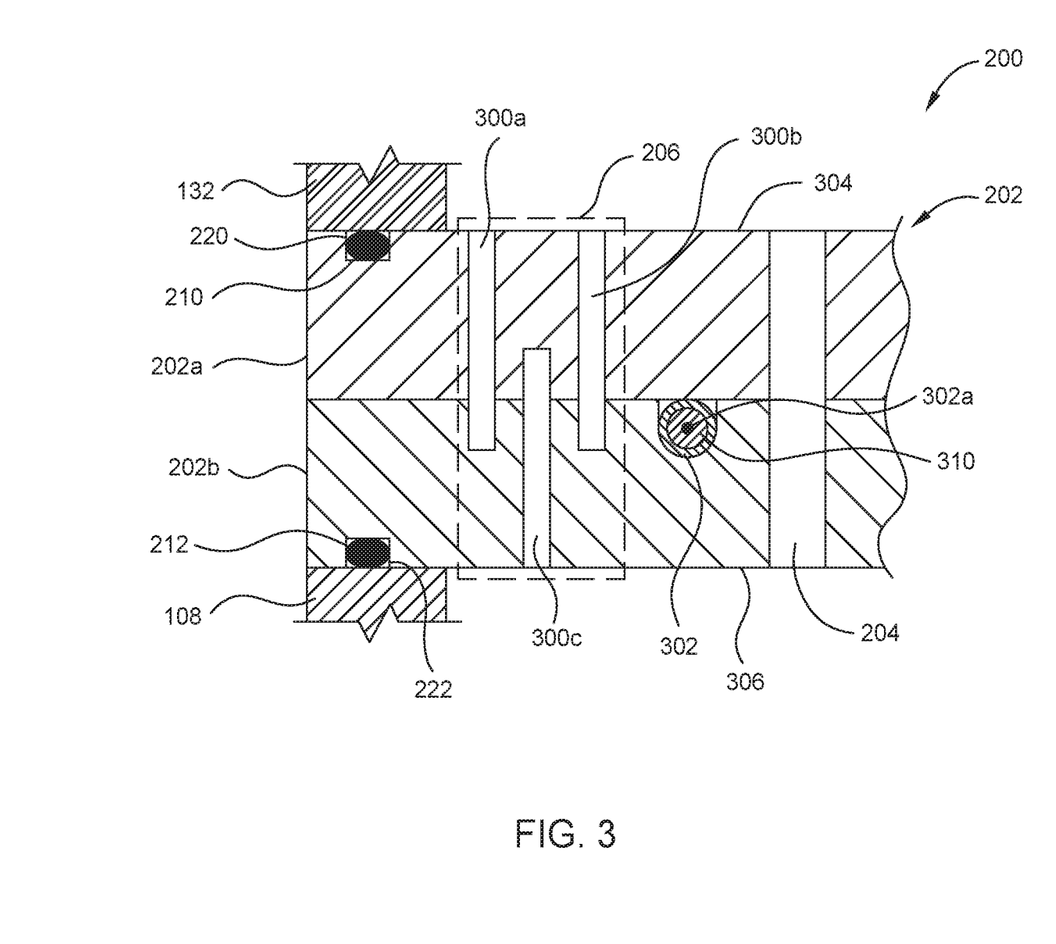
FIG. 3 illustrates a cross-sectional view of a portion of the faceplate of FIG. 2.

A flexure 206 is formed in the body 202 and partially circumscribes the plurality of apertures 204. A seal 210 is disposed radially outward from, and surrounding, the flexure 206 on an upper surface 304 (FIGS. 3 and 4) of the body 202. A second seal 212 (FIGS. 3 and 4) is similarly disposed on a lower surface 306 (FIGS. 3 and 4) of the body 202. In one embodiment, the seals 210, 212 are disposed in respective seal grooves 220, 222 (FIG. 3). In this configuration, the seals 210, 212 are O-rings formed from elastomeric materials such as polytetrafluoroethylene (PTFE), rubber, or silicone. Other seal designs, such as sheet gaskets or bonds, are also contemplated.

FIG. 3 illustrates a cross-sectional view of a portion of the faceplate 200 showing the flexure 206. The flexure 206 is formed from a series of interleaved channels 300a, 300b, 300c formed partially through the body 202. Each of the channels 300a, 300b, and 300c forms a thin bridge between an end thereof and a respective opposing surface of the body 202. For example, the channels 300a and 300b extend from the upper surface 304 of the body portion 202a through the body portion 202a and into the body portion 202b. In this embodiment, the channels 300a and 300b extend into the body portion 202b but do not extend through an entire thickness of the body portion 202b. Thus, the channels 300a and 300b extend from the upper surface 304 through the entire body portion 202a and a portion of the body portion 202b, short of the lower surface 306. The channel 300c extends from the lower surface 306 of the body portion 202b through the body portion 202b and into the body portion 202a. In this embodiment, the channel 300c extends into the body portion 202a but less than an entire thickness of the body portion 202a. As such, the channel 300c extends from the lower surface 306 through the entire body portion 202b and a portion of the body portion 202a short of the upper surface 304. In one embodiment, the channels 300a, 300b, and 300c are interleaved such that the channel 300c is disposed between the channels 300a and 300b. In the illustrated embodiment, three channels 300a, 300b, and 300c are shown forming the flexure 206 but other numbers of channels, such as one, two, four, five, or even more may be utilized.

A heater 302 is disposed within a groove 310 formed in the portion 202b of the body 202. The heater 302 has a heater lead 302a therein. The flexure 206 serves as a thermal choke which limits heat transfer from an area proximate the heater 302, such as the central portion 250 (FIG. 2), to an area radially outward of the thermal choke proximate the seals 210, 212. The temperature differential across the flexure 206 may be, for example, 50 degrees Fahrenheit, 100 degrees Fahrenheit, 150 degrees Fahrenheit, or even higher. Thus, the central portion 250 of the faceplate 200 can be heated to a high temperature, such as 350 degrees Fahrenheit, 400 degrees Fahrenheit, 500 degrees Fahrenheit, or even higher, by the heater 302 while the area across the flexure 206 proximate the seals 210, 212 is maintained at a temperature below a thermal degradation temperature of the seals 210, 212. Exemplary temperatures of the seal are below 250 degrees Fahrenheit, such as about 200 degrees Fahrenheit, or, for example, about 150 degrees Fahrenheit.

The thermal degradation temperature is considered to be the temperature at which the material used to form the seals 210, 212 begins to thermally degrade. Therefore, the seals 210, 212 provide isolation and aid in maintaining a vacuum in the plenum 148 (FIG. 1) and the process volume 110 (FIG. 1). It is understood the seals 210, 212 may be disposed in other locations, such as in a surface of the lid 108 or the cover plate 132 which opposes the faceplate 200.

Additionally, the faceplate 200 expands when the temperature thereof is increased. This thermal expansion can overstress conventional faceplate designs due to inadequate room for thermal expansion, such as constraints from mounting hardware. The flexure 206 absorbs the thermal expansion and enables the faceplate 200 to thermally expand when heated by the heater 302 without overstress.

Referring to FIG. 2, the flexure 206 partially circumscribes the plurality of apertures 204. A cutout 240 is formed through the body 202 at the flexure 206. That is, a first end 206a of the flexure 206 begins at the cutout 240 and a second end 206b of the flexure 206 ends at the cutout 240 after traversing an arc the faceplate 200. The cutout 240 has a width larger than a width of the flexure 206 so that the channels 300a 300b, 300c open into the cutout 240 at the first end 206a and the second end 206b, as indicated in shadow in FIG. 4.

The flexure 206 and the cutout 240 form a ring having a circumference surrounding the apertures 204. In one example, the flexure 206 forms greater than 75% of the circumference of the ring, such as about 85%, while the cutout 240 forms the remaining portion of the circumference. In another example, the flexure 206 forms about 95% of the circumference of the ring and the cutout 240 forms about 5% of the circumference of the ring. The cutout 240 and the flexure 206 are disposed on a common radius. That is, the cutout 240 and the flexure 206 are located at a common radial distance from a center point of the body 202.

Figure 4:
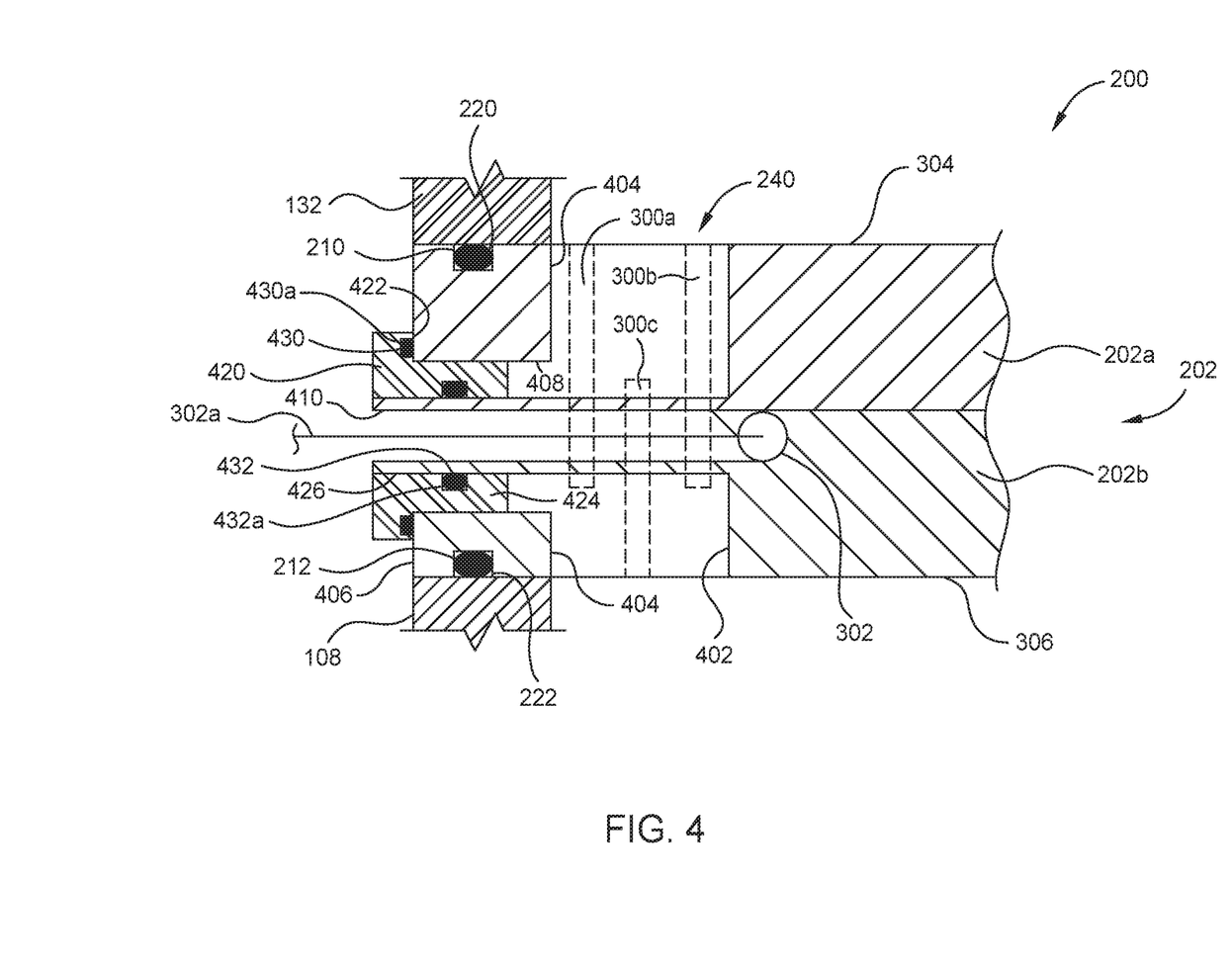
FIG. 4 illustrates a cross-sectional view of a portion of the faceplate of FIG. 2.

FIG. 4 illustrates a cross-sectional view of a portion of the faceplate 200 showing the cutout 240. As shown, the cutout 240 extends through both portions 202a, 202b of the body 202 defining a radially inner surface 402 and a radially outer surface 404 within the cutout 240. A bore 408 is formed between an outer surface 406 of the body 202 and the radially outer surface 404 of the cutout 240. A tube 410 extends from the radially inner surface 402 of the cutout 240 through the bore 408. The heater lead 302a of the heater 302 is disposed within the tube 410 enabling communication between a portion of the heater 302 disposed within the body 202 and an external power supply, such as power supply 154 of FIG. 1. In FIG. 4, the heater 302 and the heater lead 302a are shown as simple shapes for clarity.

A cap 420 is disposed surrounding a portion of the tube 410 within the bore 408. The cap 420 has a tubular extension 424 having a first diameter sized to fit within the bore 408. The cap 420 also has a shoulder 422 having a second diameter larger than the first diameter of the tubular extension 424. The shoulder 422 seats against the outer surface 406 of the body 202. An opening 426 is formed through the cap 420 and is sized for a portion of the tube 410 to be disposed therein. The cap 420 fills the space defined between the bore 408 and the tube 410.

A seal 430 is disposed in a seal groove 430a formed in the shoulder 422 and compresses between the outer surface 406 and the shoulder 422. Similarly, a seal 432 is disposed in a seal groove 432a in the tubular extension 424 and compresses between the tubular extension 424 and the tube 410. The seals 430, 432 prevent leakage of a fluid between the cap 420 and the body 202, thus aiding in maintaining a vacuum in the plenum 148 (FIG. 1) and the process volume 110 (FIG. 1). The cutout 240 functions as a thermal choke to prevent heat transfer from the heater 302 to the seals 430, 432 disposed in the cap 420. Therefore, the heater 302 can heat a central portion of the faceplate 200 to high temperatures while the seals 430, 432 are maintained at a sub-thermal degradation temperature. It is understood the seals 430, 432 may be disposed in other locations, such as in a surface of the body 202 opposing the cap 420.

Additionally, the tube 410 isolates the lead 302a of the heater 302 from the vacuum within the plenum 148 (FIG. 1) and the process volume 110 (FIG. 1). Therefore, the heater 302 can be coupled to a power supply, such as power supply 154 (FIG. 1), which is external to the process volume 110 but is capable of heating a portion of the faceplate 200 which is exposed to the process volume 110. As discussed above, the flexure 206 allows thermal expansion of the body 202 when heated by the heater 302 without overstress thereof. By forming the bore 408, the tube 410 is also able to thermally expand without overstress. The cap 420 absorbs the thermal expansion of the tube 410 while maintaining a seal between the tube 410 and the body 202.

Figure 5:
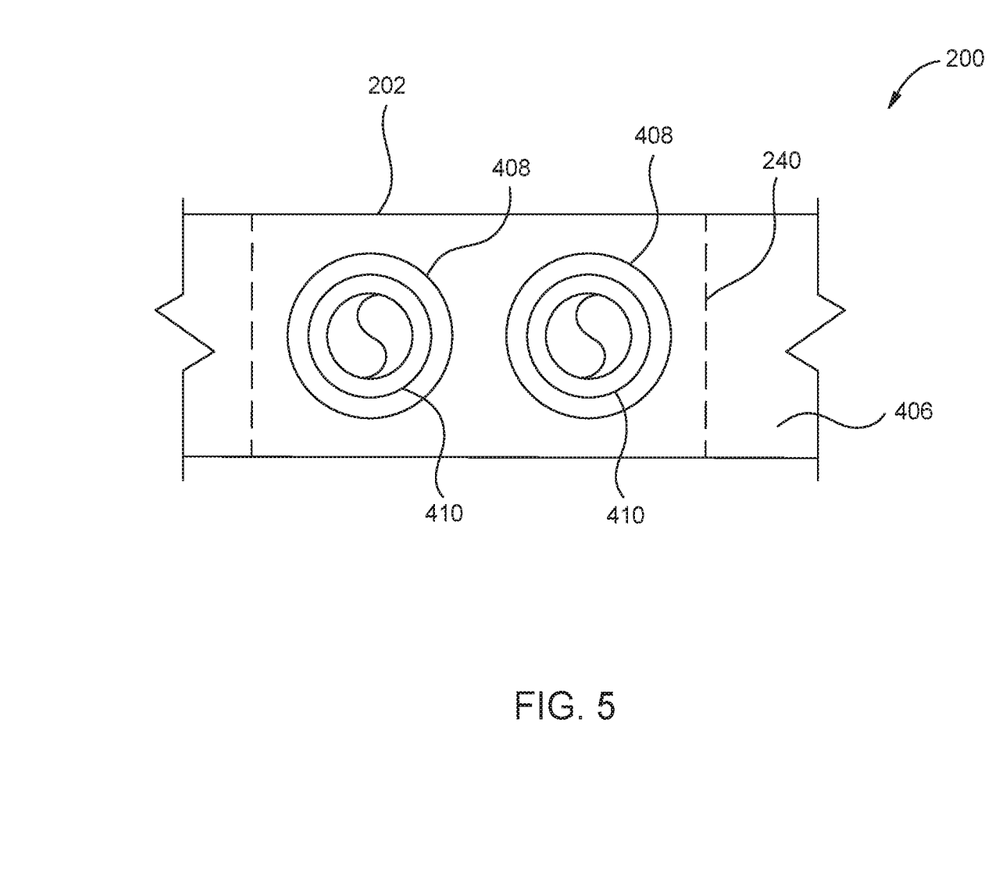
FIG. 5 illustrates a perspective view of a portion of the faceplate of FIG. 2.

FIG. 5 illustrates a side view of the faceplate 200 showing the tubes 410 with the caps 420 removed. As shown, two tubes 410 extend through respective bores 408 formed in the body 202. The bores 408 are positioned within the cutout 240 (indicated in shadow). It is understood that other numbers of tubes 410 can be used with other number of bores 408. For example, two tubes 410 may be disposed through a single bore 408.

Embodiments described herein advantageously provide a faceplate capable of being utilized in high temperature processing, such as above 350 degrees Fahrenheit or higher. By utilizing the flexure described herein, the faceplate is capable of reaching the high temperatures utilized by advanced processes. The flexure enables thermal expansion of the faceplate without overstress. Additionally, the flexure provides a thermal choke between a centrally heated portion of the faceplate and seals disposed radially outward of the flexure. The seals are maintained at a temperature below a thermal degradation temperature of the material used to form the seals. The tubes and caps as described herein are utilized to house the leads of the heater and isolate the heater from the vacuum within the processing chamber. The caps advantageously enable thermal expansion of the tubes without overstress thereof and help maintain a vacuum within the processing chamber.

While the foregoing is directed to embodiments of the present disclosure, other and further embodiments of the disclosure may be devised without departing from the basic scope thereof, and the scope thereof is determined by the claims that follow.

What is claimed is:

1. A processing chamber, comprising:
   a body having a sidewall and a bottom;
   a lid coupled to the body defining a process volume therein; and
   a faceplate coupled to the lid, the faceplate comprising:
      a body having a first surface, a second surface, and an outer surface extending between the first surface and the second surface;
      a plurality of apertures formed through the body between the first surface and the second surface;
      a flexure surrounding the plurality of apertures, the flexure partially circumscribing the plurality of apertures; and
      a cutout formed through the body abutting the flexure, the cutout and the flexure having a common radius.

2. The processing chamber of claim 1, wherein the cutout and the flexure form a ring surrounding the plurality of apertures, the flexure forming about 95% of a circumference of the ring and the cutout forming about 5% of the circumference of the ring.

3. The processing chamber of claim 1, wherein the flexure comprises a plurality of interleaved channels, and wherein the channels each open into the cutout at a first end and a second end of the flexure.

4. The processing chamber of claim 1, wherein the flexure is configured to absorb thermal expansion of the faceplate.

5. The processing chamber of claim 1, wherein the body of the faceplate comprises a first body portion and a second body portion coupled together to form the body.

6. A faceplate, comprising:
   a body having a first surface, a second surface, and an outer surface extending between the first surface and the second surface;
   a plurality of apertures formed through the body between the first surface and the second surface;
   a flexure surrounding the plurality of apertures, the flexure partially circumscribing the plurality of apertures; and a cutout formed through the body abutting the flexure, the cutout defining a radially inner surface and a radially outer surface therein, and the cutout and the flexure having a common radius.

7. The faceplate of claim 6, wherein the cutout and the flexure form a ring surrounding the plurality of apertures, the flexure forming about 95% of the circumference of the ring and the cutout forming about 5% of the circumference of the ring.

8. The faceplate of claim 6, wherein the flexure comprises a plurality of interleaved channels, and wherein the channels each open into the cutout at a first end and a second end of the flexure.

9. The faceplate of claim 6, wherein the flexure is configured to absorb thermal expansion of the faceplate.

10. The faceplate of claim 6, wherein the body of the faceplate comprises a first body portion and a second body portion coupled together to form the body.

11. The faceplate of claim 6, further comprising a first seal groove formed in the first surface and a second seal groove formed in the second surface, wherein the first and second seal grooves circumscribe the flexure and the cutout.

12. A faceplate, comprising: a body having a first surface, a second surface, and an outer surface extending between the first surface and the second surface; a plurality of apertures formed through a central portion of the body between the first surface and the second surface; a flexure partially circumscribing the plurality of apertures; a cutout formed between the first surface and second surface of the body, the cutout defining a radially inner surface and a radially outer surface therein, wherein the cutout and the flexure have a common radius; one or more bores extending between the outer surface of the body and the radially outer surface of the cutout; a tube extending from the radially inner surface of the cutout through each of the one or more bores; and a cap disposed in each of the one or more bores and surrounding a portion of each tube.

13. The faceplate of claim 12, further comprising a heater surrounding the plurality of apertures and configured to heat the central portion of the body.

14. The faceplate of claim 13, wherein leads of the heater are disposed within the tubes.

15. The faceplate of claim 12, further comprising a first seal groove formed in the first surface and a second seal groove formed in the second surface, wherein the first and second seal grooves circumscribe the flexure and the cutout.

16. The faceplate of claim 12, wherein the flexure is a thermal choke which limits heat transfer from the central portion of the body to an area radially outward of the flexure.

17. The faceplate of claim 12, wherein each cap comprises a shoulder and a tubular extension.

18. The faceplate of claim 12, wherein the cutout is a thermal choke which limits heat transfer from the central portion of the body to the caps.

19. The faceplate of claim 12, wherein the cutout and the flexure form a ring surrounding the plurality of apertures, the flexure forming about 95% of the circumference of the ring and the cutout forming about 5% of the circumference of the ring.

20. The faceplate of claim 12, wherein the flexure comprises a plurality of interleaved channels, and wherein the channels each open into the cutout at a first end and a second end of the flexure.

* * * * *